United States Patent [19]

Kottman et al.

[11] Patent Number: 4,838,289
[45] Date of Patent: Jun. 13, 1989

[54] APPARATUS AND METHOD FOR EDGE CLEANING

[75] Inventors: Rickie A. Kottman, Dallas; Robert E. Terrill, Carrollton; Ann E. Wise, Dallas, all of Tex.

[73] Assignee: Texas Instruments Incorporated, Dallas, Tex.

[21] Appl. No.: 186,783

[22] Filed: Apr. 25, 1988

Related U.S. Application Data

[60] Continuation of Ser. No. 936,877, Dec. 2, 1986, abandoned, Division of Ser. No. 834,651, Feb. 27, 1986, Pat. No. 4,685,975, which is a continuation of Ser. No. 637,687, Aug. 3, 1984, abandoned, which is a continuation of Ser. No. 404,679, Aug. 3, 1982, abandoned.

[51] Int. Cl.$^4$ ................................................. B08B 3/04
[52] U.S. Cl. ..................................... 134/153; 134/157; 134/198
[58] Field of Search ............... 134/140, 147, 149, 153, 134/157, 198; 118/320; 239/86, 193

[56] References Cited

U.S. PATENT DOCUMENTS

| | | | |
|---|---|---|---|
| 3,736,115 | 5/1973 | Blum | 134/157 X |
| 4,027,686 | 6/1977 | Shortes et al. | 134/153 X |
| 4,027,686 | 6/1977 | Shortes et al. | 134/33 |
| 4,113,492 | 9/1978 | Sato et al. | 430/271 |
| 4,161,356 | 7/1979 | Giffin et al. | 354/323 |
| 4,489,740 | 12/1984 | Rattan et al. | 134/149 X |
| 4,544,446 | 10/1985 | Cady | 134/149 X |
| 4,564,280 | 1/1986 | Fukuda | 134/153 |

FOREIGN PATENT DOCUMENTS

| | | |
|---|---|---|
| 2634144 | 2/1977 | Fed. Rep. of Germany . |
| 2715491 | 10/1977 | Fed. Rep. of Germany . |
| 29674 | 3/1978 | Japan ................................... 134/157 |
| 53-29674 | 3/1978 | Japan . |
| 36944 | 3/1980 | Japan . |
| 57-27168 | 2/1982 | Japan . |

OTHER PUBLICATIONS

"Chemical Engineers Handbook" Fourth Edition, John H. Perry, McGraw-Hill, 1963, pp. 3-222 Through 3-224.
Perry (ed.), Chemical Engineers' Handbook, Fourth Edition, Chapter 3, pp. 222-224.
IBM Technical Disclosure Bulletin, "Wafer Back Side Periphery for Simultaneous Processing", vol. 18, No. 6 (Nov. 1975), p. 1769.
IBM Technical Disclosure Bulletin, "Elimination of Photoresist Bead from Substrate Periphery", vol. 13, No. 9 (Feb. 1971), p. 2693.
IBM Technical Disclosure Bulletin, "Remover for Peripheral Resist Build-ups", vol. 19, No. 6 (Nov. 1976), pp. 2114-2115.

Primary Examiner—Philip R. Coe
Assistant Examiner—Frankie L. Stinson
Attorney, Agent, or Firm—Joseph E. Rogers; James T. Comfort; Melvin Sharp

[57] ABSTRACT

Apparatus and method for cleaning material at the outer edge of an object by applying a solvent for the material to a flat surface adjacent the edge and moving the solvent onto the edge by centrifugal force.

9 Claims, 4 Drawing Sheets

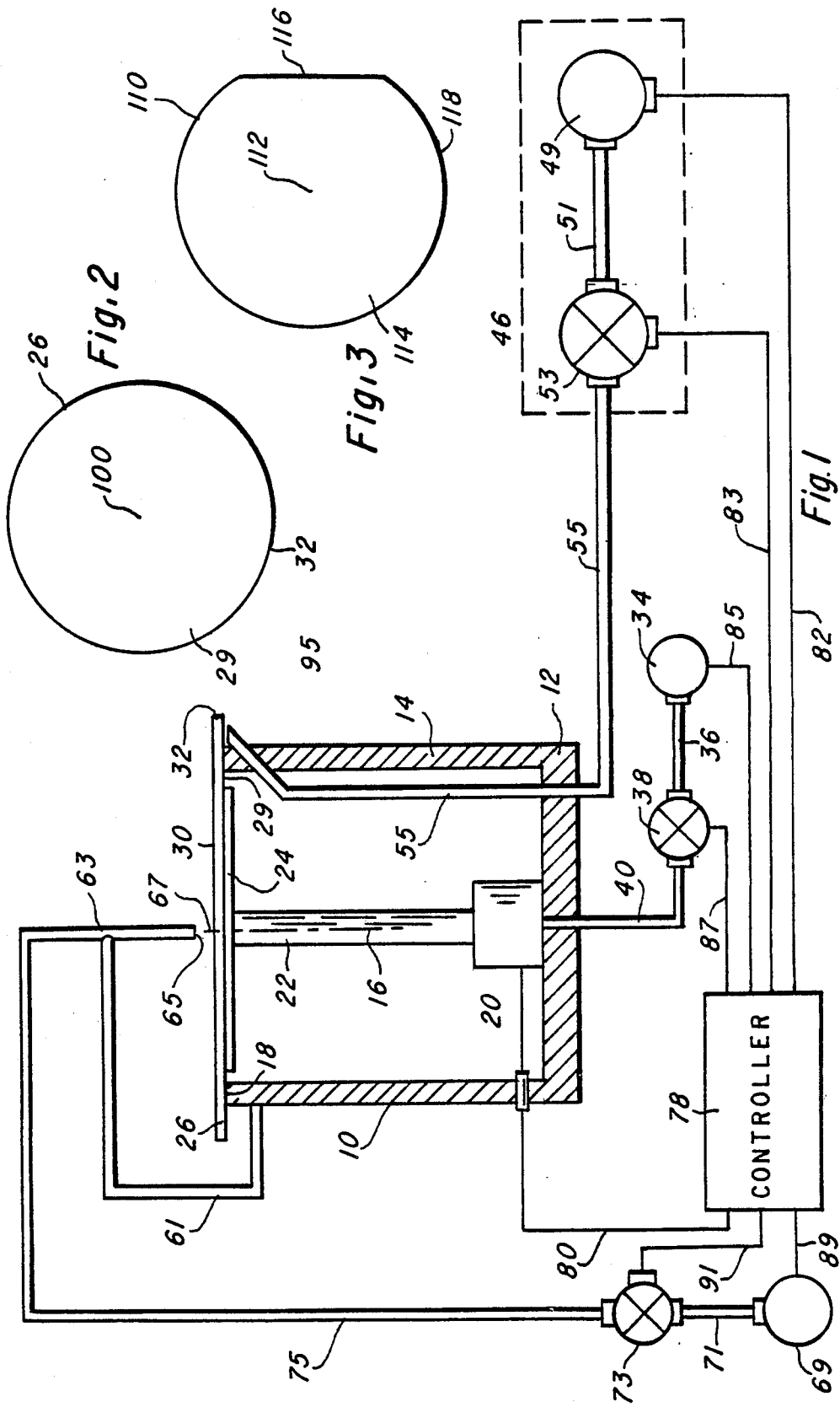

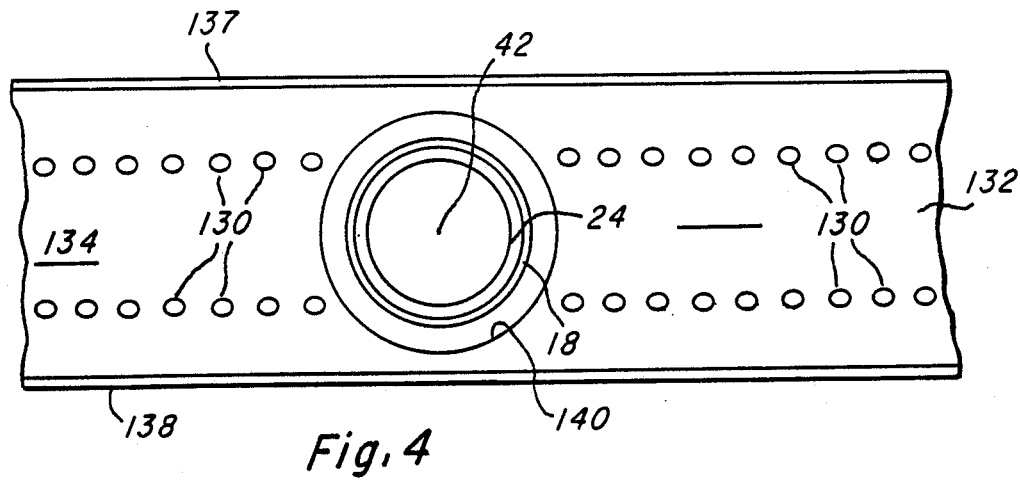
Fig. 4
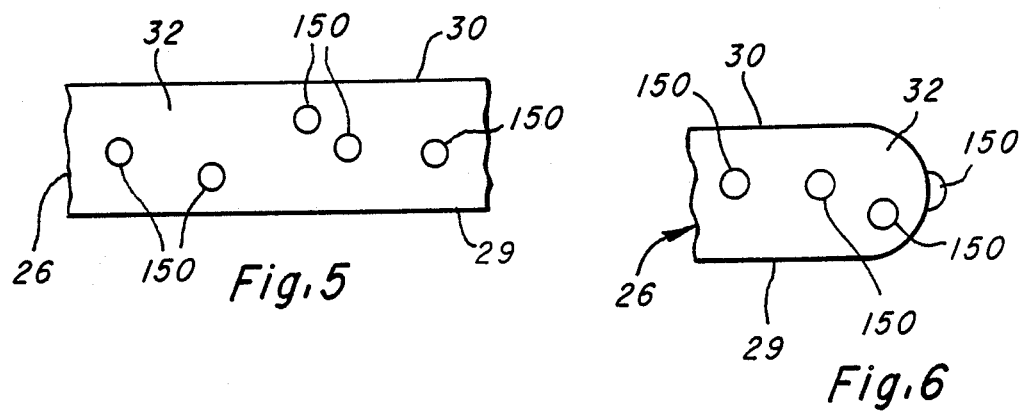
Fig. 5
Fig. 6
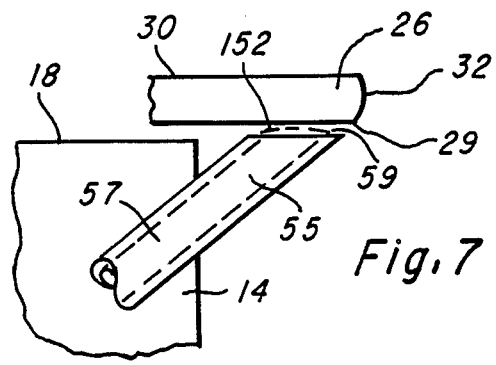
Fig. 7

APPARATUS AND METHOD FOR EDGE CLEANING

This application is a continuation of application Ser. No. 936,877, filed Dec. 2, 1986, and now abandoned, which is divisional application of patent application Ser. No. 06/834,651, filed Feb. 27, 1986, and now U.S. Pat. No. 4,685,975, which is a continuation of application Ser. No. 06/637,687, filed Aug. 3, 1984, now abandoned, which is a continuation of application Ser. No. 06/404,679, filed Aug. 3, 1982, now abandoned.

BACKGROUND OF THE INVENTION

1. Field of the Invention

This invention relates to an apparatus and method for removing undesirable material from the edge of an object, and more particularly, this invention relates to the removal of undesirable material from the edge of an object during rotation of the object by applying a solvent for removal of the undesirable material to a flat surface adjacent the edge.

2. Description of the Prior Art

During the processing of semiconductor devices, it is necessary to apply certain liquids, for example, resist, developers, and cleaning solutions to the wafer on which the semiconductor device is located. Generally, in order to apply these liquids, the wafer which has a substantially circular shape, is spun at high speed and the liquid is applied to the surface of the wafer. The apparatus for accomplishing the application of liquids to semiconductor wafers is known as a spinner. One type of spinner receives the semiconductor wafer from an air track mechanism. The air track mechanism moves the slice onto the chuck of the spinner. A vacuum is then applied through the upper surface of the chuck for frictionally engaging the wafer therewith. The vacuum overcomes the support provided by the air jets of the air track mechanism, thereby lowering the wafer and engaging it with the upper surface of the chuck. The chuck is, for example, then lowered into a chamber for application of fluid to one of the parallel surfaces of the wafer.

Generally a semiconductor wafer is comprised of, for example, a slice of monocrystalline silicon. The wafer has two parallel flat surfaces and an outer thin, convex edge which forms the perphery connecting the two surfaces. The outer edge can be generally circular, although a cut out region can be provided, which is generally referred to as a flat. The flat provides orientation information for various machinery within the semiconductor integrated circuit production environment When the spinner is prepared to apply the liquid to the semiconductor wafer, the chuck is rotated at high speed. The speed is on the order of 2000 to 6000 rpm. The axis of rotation is substantially perpendicular to the parallel surfaces of the wafer and concentric with the outer edge. Further, it is generally desirable that the axis of rotation of the chuck be approximately coincident with the center of the semiconductor wafer so that the application of the liquid to the semiconductor wafer can be at the center of the wafer in order to provide a coating across the entire surface, including the center thereof, without any gaps.

The application of liquid to semiconductor wafers is performed during the processing of the wafers to form integrated circuits thereon. The process includes many steps during which it is desirable to apply liquid to the surface of the semiconductor wafer where the structures forming the integrated circuits are located. At least some of the steps are to provide for coatings, for example, resist. The resist, which can be, for example, photoresist, ebeam resist x-ray resist, etc., of the positive or negative type, is applied as a liquid which is dried on the semiconductor wafer to form a coating thereon. The resist in the form of liquid is applied to the semiconductor wafer while it is being spun on the chuck. Although a coating is left on the surface of the semiconductor wafer to which the liquid is applied, the liquid moves outward through centrifugal force and onto the edge. At least some of the liquid remains on the edge to form deposits of resist on the edge. These deposits are generally referred to as edge beads. The edge beads are undesirable in that as the wafer is processed, various mechanisms and possibly edges of the air track can come into contact with the edge of the wafer and thereby causing the resist to flake off, forming particulate matter. It is well known that particles in the ambient environment about a semiconductor wafer are highly undesirable because the particles can cause defects in the integrated circuits they contact and adhere to.

Although a semiconductor wafer is shown herein, the present invention can be utilized with any object having a flat surface adjacent a convex edge having material thereon which it is desired to remove.

None of the known prior constructions shows the removal of undesirable material from the edge of an object having a flat surface adjacent a convex edge by the application of a solvent fluid to the flat surface by contact or gravity feed and its movement along the flat surface and out onto the convex edge by centrifugal force.

SUMMARY OF THE INVENTION

The apparatus and method of the present invention removes undesirable material from or prevents the deposit of undesirable material on the outer convex edge of an object. The outer edge has a flat surface adjacent thereto. The object can be, for example, a semiconductor wafer having two substantially parallel and flat surfaces with an outer edge extending therebetween. The edge of the semiconductor wafer is generally circular. The fluid, which is a solvent for the undesirable material is supplied under pressure through a series of conduits to a nozzle. In other words, the nozzle is in hydraulic communication with a source of the solvent under pressure. The nozzle is attached to a support which also has a chuck attached thereto.

The chuck is rotatable about an axis. The chuck is adapted to engage the object for rotation of the object about the axis with the flat surface substantially perpendicular to the axis. The portion of the flat surface adjacent the edge is rotated by the chuck over a particular location on the support. The particular location has the nozzle which, is connected to the source of fluid under pressure positioned thereat. When the object, such as a semiconductor wafer, is engaged with the chuck, the nozzle is closely adjacent the flat surface. As the fluid slowly flows out of the nozzle, surface tension allows it to expand outward from the opening in the nozzle. Since the flat surface is closely adjacent the nozzle, the outwardly expanding fluid comes into contact with the flat surface. This causes the fluid to be transferred to the flat surface while the flat surface is rotated by the nozzle. The rotation, because it is along the convex edge, applies centrifugal force to the fluid which is after transfer by contact to the flat surface. The centrifugal force causes the fluid to move outward onto the edge. Once on the convex outer edge, the fluid dissolves the undesirable material if the material is already deposited thereon. If the material is still suspended in a liquid as applied to the object, the application of solvent to the edge prevents the deposit of the material by dissolving or altering the chemical properties of the material during its deposition.

It is possible to apply the liquid having the undesirable material located therein on one spinner or in a dip operation and the material dried onto the edge. The object can then be placed onto the chuck of another spinner for removal of the material when desired. Further, the liquid can be applied to the object while the object is on the chuck and even simultaneously with the application of the fluid for dissolving the material. A controller is provided to insure the proper supply of fluid and liquid to the apparatus of the present invention and to insure that the object is engaged with the chuck. The chuck is connected to a motor which is also actuated by the controller to supply the necessary rotational movement of the chuck.

It is an advantage of the present invention to provide an apparatus and method for preventing the formation of undesirable deposits of material on the convex edge of an object having a flat surface adjacent the edge.

It is another advantage of the present invention to provide an apparatus and method for the removal of material from an edge of an object having a flat surface adjacent to the edge.

An additional advantage of the present invention is to provide a means for removing deposits of resist from the outer convex edge of a semiconductor wafer.

A further advantage of the present invention is to prevent the deposit of resist onto the edge of a semiconductor wafer.

It is another advantage of the present invention to provide an apparatus and method for removing the resist from the edge of a semiconductor wafer to prevent the generation of particles from the resist present on the edge.

It is also advantage of the present invention to provide an apparatus and method for removing resist from the edge of a semiconductor wafer within the same apparatus as the photoresist was applied.

It is a further advantage of the present invention to provide a method and apparatus for removing the resist from the back side of the semiconductor wafer adjacent the edge thereof.

BRIEF DESCRIPTION OF THE DRAWINGS

FIG. 1 is a partly electrical, partly mechanical and partly hydraulic schematic diagram of an apparatus for supplying liquid to be applied to an object and fluid for removing unwanted material;

FIG. 2 is a top view of a semiconductor wafer which is completely circular;

FIG. 3 is a top view of a semiconductor wafer having a flat provided in the outer edge of the wafer;

FIG. 4 is a top view of an air track and chuck;

FIGS. 5 and 6 are detailed views of the edge of a semiconductor wafer with edge beads of resist located thereon;

FIG. 7 is a detailed view of a nozzle and semiconductor wafer;

DESCRIPTION OF THE PREFERRED EMBODIMENT

Figure 8:
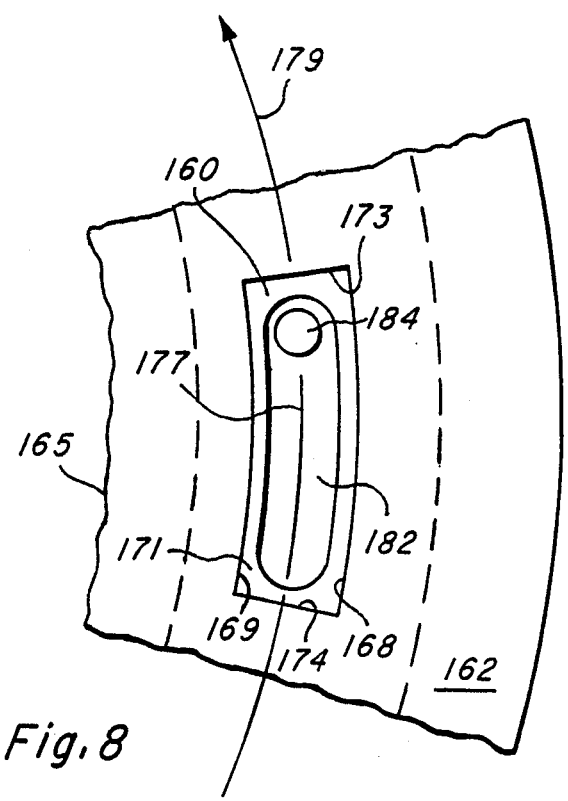
FIG. 8 is a slot in the support of the spinner mechanism.

With reference to the drawings and in particular to FIG. 1 thereof, a support 10 has a generally cylindrical shape (shown in cross section in FIG. 1 to reveal internal details). Support 10 extends upward from a base 12 in the shape of a cylinder 14. Cylinder 14 extends from base 12 about an axis 16 (as shown by a dotted line). The end of cylinder 14 away from base 12 forms a planar surface 18 which has a ring shape. Base 12 also has a motor 20 attached thereto. Motor 20 as shown in FIG. 1, is an electric motor, however, it can be, for example, hydraulic or pneumatic. A shaft 22 extends upward along axis 16 from and is rotatably attached to motor 20. Shaft 22 at its end away from motor 20 is rigidly affixed to a chuck 24. Chuck 24 is generally circular and is concentric about axis 16. As shown in FIG. 1, chuck 24 is adapted to engage a semiconductor wafer 26. Although wafer 26 is shown in FIG. 1, any suitably shaped object can be utilized with the present invention if the chuck 24 can be modified to provide the necessary engagement. Semiconductor wafer 26 has two flat and generally parallel surfaces 29 and 30. Surface 29 is engaged with the chuck 24 and is spaced from and closely adjacent to the planar surface 18 of cylinder 14. Semiconductor wafer 26 also has an outer convex edge 32 extending between surfaces 29 and 30. As shown in FIG. 1, the diameter of wafer 26 is slightly greater than the diameter of planar surface 18 of cylinder 14.

In order to engage the wafer 26 with chuck 24, a vacuum is applied between chuck 24 and surface 29 of wafer 26. A vacuum source 34 is connected through a conduit 36 to a solenoid valve 38. A conduit 40 is connected between valve 38 and chuck 24 for selective connection of the vacuum source 34 by valve 38 to chuck 24. An opening 42 in chuck 24 is connected to conduit 40. Conduit 40 extends from valve 38 through base 12 and shaft 22 to chuck 24. When valve 38 opens, a vacuum is applied to hole 42 (FIG. 4) to hold the slice 26 in frictional engagement with chuck 24.

A fluid source 46 includes a reservoir 49 connected through a conduit 51 to a pressure regulator 53. Reservoir 49 contains a fluid which is a solvent for the resist. The resist is either to be applied or has been applied to the wafer 26. The fluid within reservoir 49 is under pressure. The solvent under pressure is applied through conduit 51 to pressure regulator 53. The output of pressure regulator 53 to conduit 55 is at a controlled known pressure. It has been found useful to have this pressure at slightly greater than the air pressure of the surrounding ambient environment. Conduit 55 passes through base 12 and along a portion of the cylinder 14 and through cylinder 14 at a location closely adjacent to surface 18. The end 57 of conduit 55 away from the connection to regulator 53 terminates in a nozzle 59 (FIG. 7) which has an opening therein closely adjacent to the surface 29 of wafer 26, when wafer 26 is located on chuck 24. Regulator 53 can also act as a cutoff valve to stop the flow of solvent when a wafer, for example, wafer 26 is not located on chuck 24 or as desired.

Support 10 includes a bracket 61 extending from cylinder 14 in a general U shape with one leg of the U connected to cylinder 14, the base of the U extending upward above surface 18 with its other leg extending horizontally above surface 18, at least a distance sufficient to allow wafer 26 to pass therebetween. A nozzle 63 is connected to bracket 61 extending above cylinder 14 with an outlet 65 therein for directing a stream of liquid 67 (shown by a dotted line) onto surface 30 of wafer 26. The liquid supplied to nozzle 63 is under pressure from a pressurized supply 69 of the liquid. The output of supply 69 is connected through conduit 71 to a pressure regulator 73. Pressure regulator 73 is connected through conduit 75 to nozzle 63 to supply liquid thereto. Pressure regulator 73 is also equipped to shut off the flow of liquid when desired. An electrical controller 78 is connected through a multiline channel 80 to motor 20. Controller 78 through multichannel 80 controls the various functions, including spin speeds, performed by motor 20. Controller 78 is also connected through lines 82 and 83 to reservoir 49 and regulator 53, respectively. Controller 78 is also connected through lines 85 and 87 to vacuum supply 34 and valve 38, respectively. Finally, controller 78 is connected through lines 89 and 91 to supply 69 and regulator 73, respectively. Controller 78 is adapted to perform the necessary functions for the general operation of the spinner 95. Spinners are shown in U.S. Pat. No. 3,888,674 issued to Nygaard on June 10, 1975 and entitled "Automatic Slice Processing" and U.S. Pat. No. 4,027,686 issued to Shortes et al on June 7, 1977 and entitled "Method and Apparatus for Cleaning the Surface of a Semiconductor Slice with a Liquid Spray of De-ionized water, which are incorporated by reference hereinto.

In operation, after wafer 26 is lowered onto chuck 24, controller 78 causes valve 38 to open, applying a vacuum through opening 42 (FIG. 4) to engage wafer 26 with chuck 24. Since the upper surface of chuck 24 is slightly further away from base 12 than the upper surface 18 thereof, wafer 24 is free and rotatable with chuck 24 without contacting surface 18. Slightly closer to, but still spaced from surface 29, is the nozzle 59 (FIG. 7). Controller 78 through channel 80 turns on motor 20 at a preselected speed. Motor 20 rotates chuck 24 through shaft 22 about axis 16. The speed can be, for example, for a thick coat of resist at 2,000 RPM or for a thin coat of resist at 6,000 RPM. Prior to actuating the motor, controller 78 then causes regulator 73 to supply liquid from supply 69 to nozzle 63 which in turn directs the liquid onto the surface 30 of wafer 26. The liquid is generally directed at the center of the wafer which is coincident with axis 16. Since it is desired to prevent the formation of the resist on the edge 32 of wafer 26, controller 78 causes regulator 53 to supply fluid to dissolve the resist through conduit 55 from reservoir 49 to nozzle 59 (FIG. 7) for transfer to surface 29 of wafer 26. In the alternative, after controller 78 causes regulator 73 to close preventing any further liquid from being directed onto surface 30 of wafer 26, controller 78 can then open regulator 53 to allow fluid to be transferred to the surface 29 while motor 20 continues to rotate the wafer 26. If the fluid from reservoir 49 is transferred to wafer 26 at a time when liquid from supply 69 is not being directed onto the wafer, motor 20 can be directed by controller 78 to rotate at another speed different from the speed of rotation utilized when liquid was being directed onto wafer 26. Further, nozzle 59 (FIG. 7) can be located adjacent surface 30, i.e., above the wafer 26 for applying fluid for dissolving the resist to the portion of surface 30 adjacent edge 32. The rate of flow provided by regulator 53 can be, for example, 100 CC per minute with the inner diameter of the opening end nozzle 59 (FIG. 7) of 1/16 of an inch.

As shown in FIG. 2, surface 29 of wafer 26 is circular. Convex surface 32 which extends between surface 30 (FIG. 1) and surface 29 is concentric about the center 100 of surface 29. Wafer 26 can be, for example, any material utilized for making integrated circuits, such as silicon, gallium arsenide, etc.

Another wafer 110 is shown in FIG. 3. Wafer 110 has a center 112 and a substantially circular flat surface 114. However, wafer 110 has a cut out portion or flat 116. Flat 116 is tangential to a radius from center 112. Wafer 110 has a flat surface opposite to surface 114 (not shown) which is of identical shape with a convex edge 118 extending between the two flat surfaces (only surface 114 is shown in FIG. 3) of wafer 110. Center 112 is concentric with the curved portion of edge 118. Flat 116 comprises part of the outer periphery of the wafer 110 and extends between the two flat surfaces (only surface 114 is shown in FIG. 3). Flat 116 and convex edge 118 comprise the outer periphery of wafer 110. It was found when utilizing the type of wafer such as wafer 110 with the apparatus shown in FIG. 1 that the flat can cause spraying of surface 114 with solvent when flat 116 encounters nozzle 59 (FIG. 7), because the opening in nozzle 59 would be further away from axis 16 (FIG. 1) than the center of flat 116. In other word, when viewed from above, the opening in nozzle 59 (FIG. 7) would be periodically exposed during a portion of the rotation which brought flat 116 adjacent to the end 57 of conduit 55. A cam action can be provided between the motor 20 (FIG. 1) and the chuck 24 (FIG. 1) to compensate for the flat.

FIG. 4 shows an apparatus for loading and unloading chuck 24. A plurality of supporting air jets 130 directs air upward and toward the right as shown in FIG. 4. These air jets support and direct wafers, such as wafer 26 (FIG. 1) generally along an air track 132 from left to right. The air track has a substantially flat bottom 134 in which air jets 130 are located. Two parallel rails 137 and 138 extend along either edge of bottom 134 and extend upward thereof. If wafer 26 moves toward one side or the other, rails 137 or 138 redirect the wafer toward the center of bottom 134. Rails 137 and 138 are parallel to the longitudinal center line of bottom 134. In order to load 26 onto chuck 24, the chuck 24 can be moved upward to contact the bottom of the slice which is supported by a portion of the air track which extends over opening 140 which has been removed and is not shown in FIG. 4 except for an opening sufficient to allow the chuck to move through. After a chuck 24 moves the slice 26 upward the portions of the air track which covered opening 140 are moved. Then slice 26 is moved by chuck 24 down into opening 140 close to the planar surface 18. The operation of the spinner then continues as discussed above in connection with FIG. 1. After the spinning operation, including the application of the fluid from reservoir 49 (FIG. 1), chuck 24 is raised above the bottom 134 of air track 132 and the portions of the air track (not shown) which were removed from opening 140 are replaced and the chuck is lowered to a plane coincident with the plane of bottom 134. Solenoid valve 38 shuts off the vacuum applied through hole 42 to wafer 26. This allows the air jets 130 to raise the wafer 26 above the bottom 134 of the air track 134 and moves it toward the right (as shown in FIG. 4). Although utilizing the present invention with an air track has been found useful, any other method for loading the chuck 34 with wafer 26 can be utilized, for example, manual placement, various electromechanical apparatus which can include positioning sensors, etc.

As shown in FIGS. 5 and 6, a plurality of edge beads 150 are located on edge 30 of wafer 26. The edge beads are the result of applying photoresist to the surface 30 of wafer 26 and form on the edge 32 thereof. The presence of these edge beads 150 is undesirable because when the edge 30 of wafer 26 contacts an object, for example, the rails 137 and 138 (FIG. 4), there is a tendency to generate particulate matter. As is well known, particulate matter present in the close proximity of a semiconductor wafer is undesirable because the particles can settle onto integrated circuits on the wafer and cause defects in further processing steps.

As shown in FIG. 7, wafer 26 has its flat surface 29 and in particular the portion thereof adjacent to edge 32 closely adjacent to the end 59 of nozzle 55. The flow rate of the fluid exiting the end 59 of nozzle 57 can be, for example, approximately 100 cubic centimeters per minute with the inner diameter of the hole in the end 59 of nozzle 57, for example, 1/16 of an inch. At this low flow rate, the fluid shown by dotted line 152 is formed into a convex shape by surface tension forces which moves upward to contact surface 29 of wafer 26. As the fluid is transferred by contact with surface 29 of wafer 26, it is moved outward by centrifugal force as the wafer 26 is rotated and moves along a surface 29 outward toward edge 32. The centrifugal force moves the fluid along surface 29 and over edge 32. When the fluid comes into contact with the edge beads 150 (FIGS. 5 and 6), on edge 32, it dissolves the edge beads 150 which results in a surface free from resist. After the resist is removed, if wafer 26 comes into contact with either rail 137 or 138 (FIG. 4), particulate matter resulting from the edge beads contacting the rails does not occur. The wafer 26 can be located at approximately 0.010 inches from nozzle 59.

Figure 9:
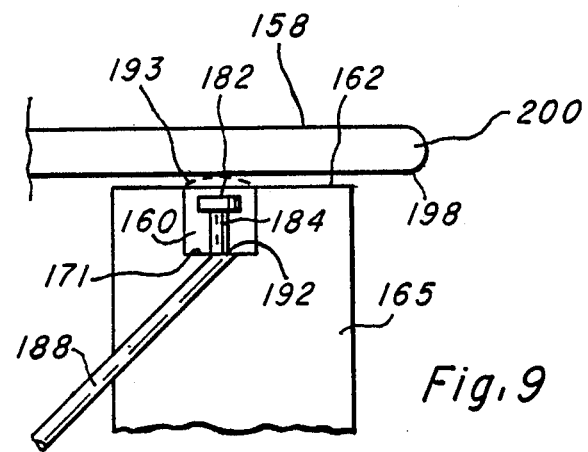
FIG. 9 is a cross-sectional view taken along line 9—9 of FIG. 8.

As shown in FIGS. 8 and 9, a slot 160 is utilized to provide the fluid to the lower surface of a wafer 158 which can be similar to wafer 26. An arcuate slot 160 or opening is located in the upper planar surface 162 of a cylinder 165 similar to cyclinder 14 (FIG. 1). Slot 160 has two slightly curved and parallel sides 168 and 169. Slot 160 also has a bottom 171 which is parallel to surface 162. Bottom 171 extends between sides 168 and 169 and between ends 173 and 174 of slot 160. The arcuate longitudinal centerline 177 is generally concentric about the axis of cylinder 165. End 173 lies in the direction of arrow 179 as shown in FIG. 8 from end 174. A baffle 182, which also has an arcuate shape, extends along the longitudinal centerline 177 of slot 160. Baffle 182 is supported by and attached at the upper end of a rod 184 (FIG. 9) which is attached at its other opposite end to bottom 171. Baffle 182, as shown in FIG. 9, extends parallel to surface 162. As shown in FIG. 8, rod 184 is attached to bottom 171 adjacent, but spaced from, end 173 of slot 160. The baffle, when attached as shown in FIG. 8, extends opposite to the direction arrow 179 along the longitudinal centerline 177 of slot 160. Rod 184 can be attached adjacent but spaced from the end 174 of slot 160 and extend toward end 173 along the longitudinal center line 177 of slot 160. As shown in FIG. 8, slot 160 is elongated in the direction of arrow 179 from end 174 to another opposite end 173. The slot is 2 inches along from end 173 to end 174 and 0.25 inches wide from side 168 to side 169.

As shown in FIG. 9, cylinder 165 has a conduit 188 extending through cylinder 165 to the bottom 171, forming an opening 192 in bottom 171 through which fluid is supplied by a fluid source similar to fluid source 46 (FIG. 1). The baffle directs the fluid generally along the longitudinal centerline 177 of slot 160. As shown in FIG. 9, rod 184 and baffle 182 do not extend above the planar surface 162 of cylinder 165.

Opening 192, which is connected through conduit 188 to a source of fluid for dissolving the resist under pressure (similar to source 46 in FIG. 1), which directs fluid into slot 160. Baffle 182 directs the fluid along the arcuate center line 177 (FIG. 8) toward end 174 (FIG. 8) of slot 160. Fluid is supplied at the rate of approximately 60 cubic centimeters per minute through opening 192, having an inner diameter of 0.125 inches. The wafer 158, positioned much like the wafer 26 in FIG. 7 positioned over nozzle 57, is positioned adjacent to slot 160 which allows the fluid (shown by dotted line 193) under the effect of surface tension, to move upward as fluid continues to enter the slot from conduit 188. The wafer is sufficiently close to the planar surface 162, so that as the fluid moves upward utilizing surface tension, it contacts the lower flat surface 198 of the wafer and is transferred thereto by contact. As the wafer is rotated, fluid in contact with the lower surface of the wafer moves outward onto the edge 200 of the wafer and thereby removes the resist therefrom. The above described arrangement has been found useful in reducing the problems encountered with the rotation of a flat, such as flat 116 in FIG. 3, over the contacting fluid, for example, the fluid shown by dotted line 152 extending from nozzle 57 in FIG. 7. The edge 200 has an arcuate cross-sectional shape extending between the flat surface of wafer 158.

Figure 10:
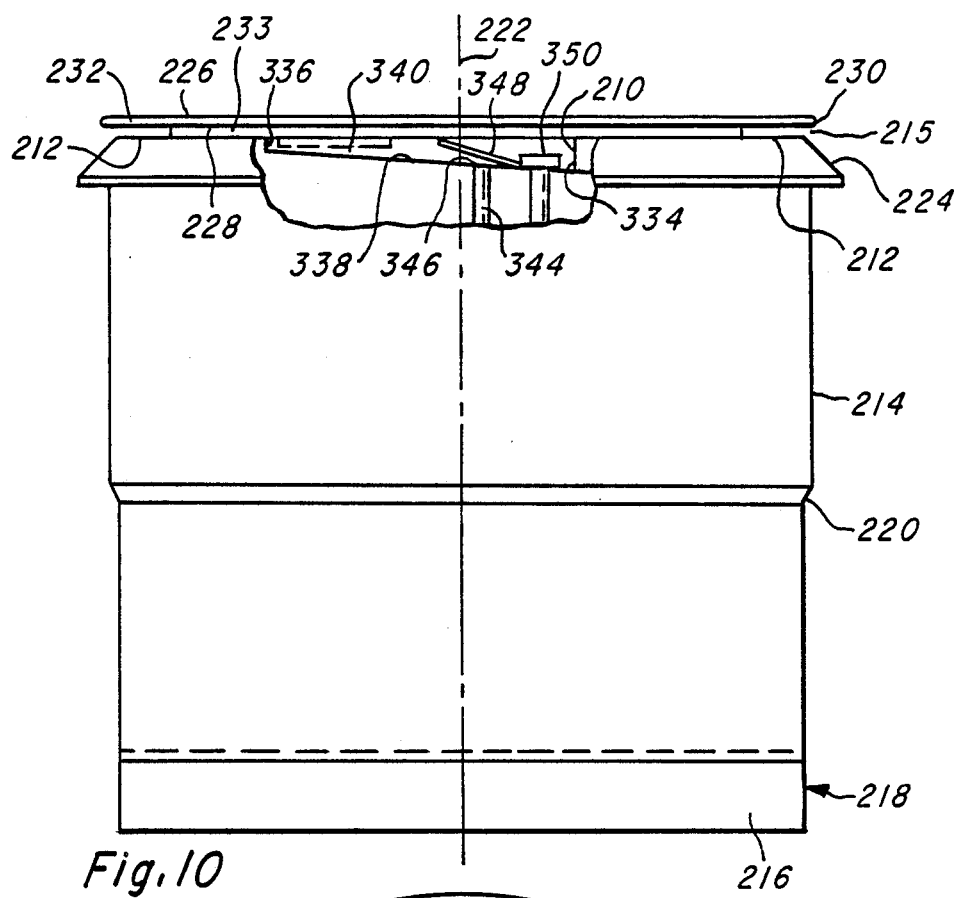
FIG. 10 is a side view of a support with a slot therein with portions cut away to reveal internal details.
Figure 11:
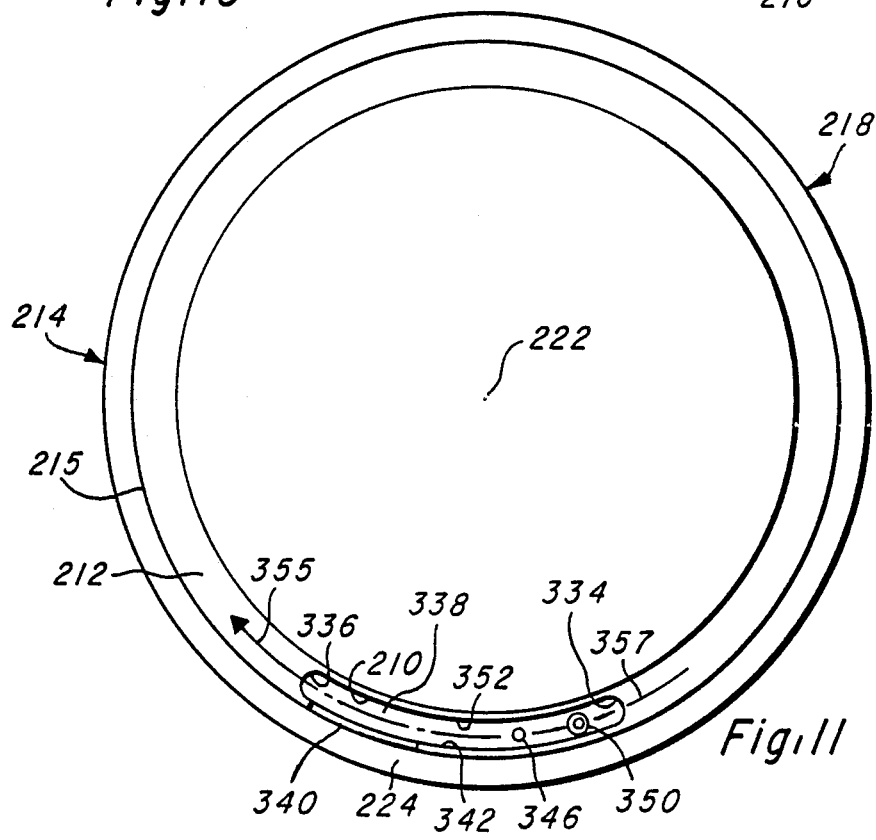
FIG. 11 is a top view of a support and the slot therein shown in FIG. 10.

As shown in FIGS. 10 and 11, another slot 210 is positioned in the upper planar ring shaped surface 212 of cylinder 214 and base 216 comprise a support 218. Support 218 is similar to support 10 in FIG. 1. However, cylinder 214 is provided with a beveled edge 220 which extends between portions of the cylinder 214 which have different radiuses from the axis 222 of cylinder 214. The portion having the greater outer diameter is located between bevel 220 and upper planar surface 212. Cylinder 214 is also provided with a skirt which extends from the outer edge 215 of planar surface 212 outward and downward. Skirt 224 extends a short distance outward and allows any fluid or liquid to be carried away from the outer surface of cylinder 214 and allowed to fall to the floor (not shown) which is supporting base 216.

Wafer 226 is shown positioned in FIG. 10 with its lower surface 228 adjacent its outer convex edge 230 parallel to and adjacent to planar surface 212. (The wafer as shown in FIG. 10 is spaced from surface 212 a distance greater than normal in operation to expose a portion of chuck 232.) Wafer 226 is provided with another flat and parallel surface 232. As shown in FIG. 10, slot 210 slopes from end 334 upward toward planar surface 212 to another end 336. The bottom 338 of slot 210 slopes with respect to the plane of planar surface 212. The bottom 338 has a greater depth at its portion adjacent end 334 than the portion thereof adjacent end 336. A shallow slit or notch 340 (shown by a dotted line in FIG. 10) extends from the side 342 of slot 210 (FIG. 11) to the outer edge 125 of planar surface 212 to allow fluid to flow thereacross and outward to skirt 224. This allows any excess fluid within slot 210 to be discharged through notch 340. Notch 340 is basically a shallow overflow mechanism or spillway to prevent excess fluid from building up above slot 210. Excessive fluid can cause contamination of the upper surface 232 of the wafer 226 which can, under certain circumstances, be undesirable. The wafer 226 can be positioned on a chuck 232 similar to chuck 24 (FIG. 1). The chuck having wafer 226 engaged therewith would be rotated by a motor (similar to motor 20 in FIG. 1). Apparatus similar to nozzle 36 and supply 69 would be provided to coat the upper surface 232 of wafer 226 with resist. In order to remove the edge beads (similar to edge beads 150 in FIGS. 5 and 6) from edge 230, fluid which can dissolve the resist, including that forming the edge beads similar to edge beads 150 in FIG. 5 on edge 230, is supplied to slot 210 through a conduit 344 and an opening 346 in bottom 338 of slot 210. A baffle 348 is clamped to bottom 338 adjacent, but spaced from, end 334 of slot 210 by a bolt 350 which is threadily engaged into cylinder 214. Baffle 348 extends upward from bottom 338 and toward end 336 of slot 210. The end of baffle 348 attached to bolt 350 is closer to bottom 338 than its other opposite end. Neither baffle 348 nor bolt 350 extend above the plane of planar surface 210. The slope of baffle 248 is greater than the slope of bottom 338 with respect to the plane of surface 212.

A top view of support 218 is shown in FIG. 11. As shown in FIG. 11, slot 210 has an arcuate shape with parallel sides 342 and 352. The sides 342 and 352 extend from end 334 to end 336. Although bolt 350 is shown in FIG. 11, baffle 348 has been removed to reveal the location of opening 346. The fluid, which is a solvent, issues from hole 346 and is directed by baffle 348 (FIG. 10) in the direction of arrow 355 along the longitudinal centerline 357, which has an arcuate shape. Sides 342 and 352 of slot 210 are concentric about axis 222 as is planar surface 212, which is ring shaped.

The slot 210 is approximately 1 inch long, 0.125 inches wide, and ranges from a depth of 0.1875 at end 334 to a depth of 0.0625 at end 336. The opening diameter and flow rate are similar to that for slot 160 (FIG. 8).

As the fluid from opening 346 fills slot 210, surface tension causes it to extend upward from slot 210 above the plane of planar surface 212. It then comes into contact with wafer 226 and is transferred to surface 228 thereof by contact. As wafer 226 is rotated, the fluid which is transferred to wafer 226, and specifically to surface 228 thereof, is driven by centrifugal force outward onto edge 230 to remove the resist. The photoresist utilized can be, for example, positive resist having a viscosity of 18, and the solvent utilized herein as the fluid being dispensed by nozzle 63, slot 160, and slot 210 can be, for example, HMDS (AZ thinner). As utilized herein, a convex edge means an edge which, when a flat surface adjacent thereto is moved over a particular location, outward centrifigal force is generated to push the fluid toward the edge. This can most readily occur in a situation where a round object or almost round object is rotated about its center, although many other shapes can be utilized with the present invention.

Whereas the present invention has been described in particular relation to the drawings attached hereto, it should be understood that other and further modifications apart from those shown or suggested herein, may be made within the spirit and scope of this invention.

What is claimed is:

1. Apparatus for removing a deposit of material from an outer convex edge of an object having a substantially flat surface adjacent said edge, comprising:
    (a) a nozzle with an outlet end located in proximity to said surface near said edge;
    (b) a solvent at said outlet end of said nozzle in the form of a convex shaped reservoir created by surface tension forces of said solvent sufficiently close to said substantially flat surface to enable solvent transfer thereto; and
    (c) a chuck for engaging and spinning said object to bring the transferred solvent into contact with said edge to thereby remove said material deposit.

2. The apparatus of claim 1, wherein said substantially flat surface is a bottom surface.

3. The apparatus of claim 1, further comprising:
    means for supplying said solvent under pressure sufficient to form said convex shaped reservoir.

4. The apparatus of claim 3, wherein said pressure is sufficient to supply said solvent to said convex shaped reservoir at a rate of approximately 100 cubic centimeters per minute.

5. The apparatus of claim 1, wherein said outlet end is located approximately 0.010 inches from said surface.

6. The apparatus of claim 1, wherein said nozzle includes a slot for solvent delivery.

7. The apparatus of claim 6, further comprising:
    a spillway adjacent said slot to prevent excess fluid from building up above said slot.

8. The apparatus of claim 1, wherein said object is a monocrystalline semiconductor wafer.

9. The apparatus of claim 1, wherein said material removed from said object is a resist.

* * * * *